United States Patent
Nakano et al.

(10) Patent No.: US 8,746,174 B2
(45) Date of Patent: Jun. 10, 2014

(54) DISCHARGE SURFACE TREATMENT APPARATUS AND DISCHARGE SURFACE TREATMENT METHOD

(75) Inventors: Yoshikazu Nakano, Chiyoda-ku (JP); Akihiro Goto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/820,909

(22) PCT Filed: Jun. 26, 2012

(86) PCT No.: PCT/JP2012/066262
§ 371 (c)(1),
(2), (4) Date: Mar. 5, 2013

(87) PCT Pub. No.: WO2014/002188
PCT Pub. Date: Jan. 3, 2014

(65) Prior Publication Data
US 2013/0344651 A1 Dec. 26, 2013

(51) Int. Cl.
*C23C 16/00* (2006.01)
*H01J 37/32* (2006.01)

(52) U.S. Cl.
CPC ..... *H01J 37/32559* (2013.01); *H01J 37/32568* (2013.01)
USPC ............... 118/723 E; 257/E21.171; 427/577; 427/569

(58) Field of Classification Search
CPC ................... H01J 37/32559; H01J 37/325568
USPC ........ 118/623, 723 E; 257/E21.172; 427/577, 427/569
See application file for complete search history.

(56) References Cited

U.S. PATENT DOCUMENTS

| | | | |
|---|---|---|---|
| 5,585,014 A | 12/1996 | Magara | |
| 7,521,786 B2 * | 4/2009 | Kitabatake et al. | 257/686 |
| 7,892,410 B2 * | 2/2011 | Goto et al. | 205/83 |
| 2004/0124474 A1 * | 7/2004 | Kitabatake et al. | 257/365 |
| 2006/0071246 A1 * | 4/2006 | Kitabatake et al. | 257/270 |
| 2006/0213777 A1 * | 9/2006 | Goto et al. | 205/83 |
| 2007/0289949 A1 | 12/2007 | Suzuki et al. | |
| 2008/0317974 A1 * | 12/2008 | de Vries et al. | 427/569 |
| 2009/0246463 A1 | 10/2009 | Akiyoshi et al. | |
| 2013/0069015 A1 * | 3/2013 | Sumi et al. | 252/512 |
| 2013/0164496 A1 * | 6/2013 | Goto et al. | 428/141 |

FOREIGN PATENT DOCUMENTS

| | | |
|---|---|---|
| JP | 11-129119 A | 5/1999 |
| JP | 2005-213554 A | 8/2005 |
| JP | 5040312 B2 | 10/2012 |
| JP | 5092742 B2 | 12/2012 |
| WO | 2006/046630 A1 | 5/2006 |

* cited by examiner

*Primary Examiner* — Telly Green
(74) *Attorney, Agent, or Firm* — Sughrue Mion, PLLC

(57) ABSTRACT

A discharge surface treatment apparatus supplies an electrode material to a surface of a treatment target member by generating pulsating discharges across an inter-electrode gap to form a coating of the electrode material, and includes a switching element that turns application of a voltage from a power source to the inter-electrode gap on/off, a capacitance element that is connected to the switching element in parallel with the inter-electrode gap, an inductance element that is connected in series between both of the switching element and the capacitance element and the inter-electrode gap, and a control unit that includes a function of periodically performing on/off so that an induced electromotive force generated in the inductance element due to a change in the current of discharge generated across the inter-electrode gap can be used as a voltage that induces the next discharge.

10 Claims, 7 Drawing Sheets

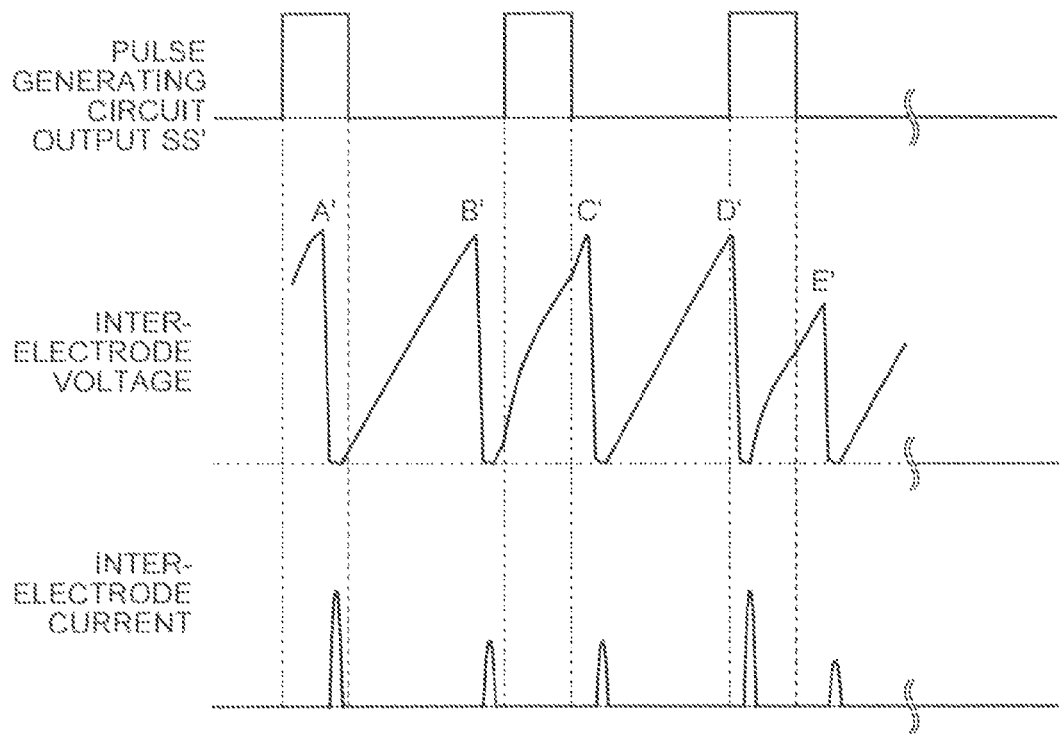

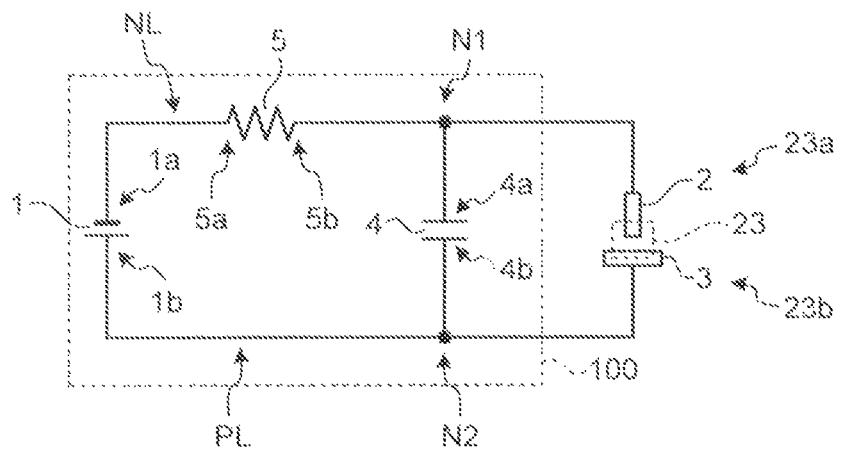

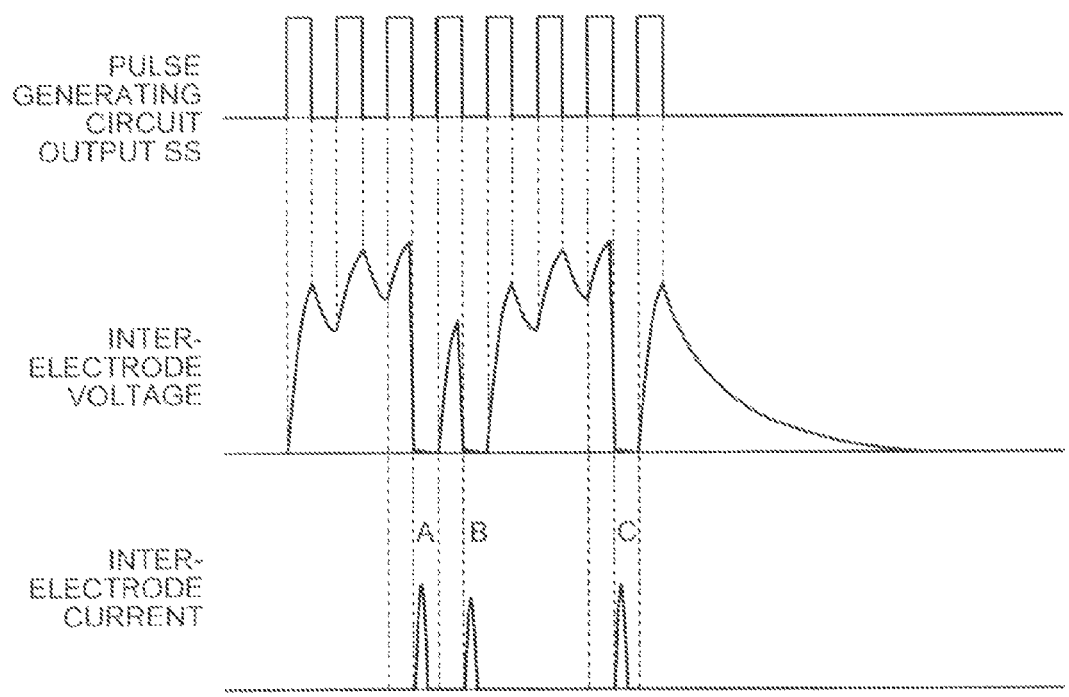

DISCHARGE SURFACE TREATMENT APPARATUS AND DISCHARGE SURFACE TREATMENT METHOD

CROSS REFERENCE TO RELATED APPLICATIONS

This application is a National Stage of International Application No. PCT/JP2012/066262 filed Jun. 26, 2012, the contents of all of which are incorporated herein by reference in their entirety.

FIELD

The present invention relates to a discharge surface treatment apparatus and a discharge surface treatment method.

BACKGROUND

For a discharge surface treatment in which an electrode material is supplied to the surface of a treatment target member by generating a pulsating discharge across an inter-electrode gap, which is the clearance between a discharge surface treatment electrode and the treatment target member, and a coating made of the electrode material is formed on the surface of the treatment target member, as a circuit that generates a low-energy discharge, there is a capacitor circuit that causes the charge supplied from a DC power source to be stored in a capacitor provided between the DC power source and the inter-electrode gap. In this capacitor circuit, when the charging voltage of the capacitor becomes high, breakdown of the inter-electrode gap occurs and an electric discharge occurs; therefore, a discharge current flows to the inter-electrode gap from the capacitor and the charging voltage of the capacitor decreases. The discharge surface treatment of the treatment target member is performed by repeatedly charging and discharging the capacitor. In the treatment using the capacitor circuit, it is possible to generate a discharge of low discharge energy with a low peak current value and a narrow pulse width by adjusting the electrostatic capacitance of the capacitor, whereby a treated surface having a low surface roughness can be obtained.

On the other hand, Patent Literature 1 discloses an electric discharge machining power supply apparatus that turns on/off a switching element provided between the DC power source and the capacitor in accordance with predetermined pulse trains.

CITATION LIST

Patent Literature

Patent Literature 1: International Publication Pamphlet No. WO 2006/046630

SUMMARY

Technical Problem

In a treatment using the capacitor circuit described above, although an electric discharge of low discharge energy can be generated, it takes a relatively long time to charge the capacitor (capacitance element); therefore, a sufficient frequency of occurrence of discharges (hereinafter may be referred to just as "discharge occurrence") cannot be obtained and thus a great deal of time is required for the treatment. Therefore, it is difficult to improve the treatment speed of the discharge surface treatment.

On the other hand, as described in Patent Literature 1, in the case of a power circuit of a system that continuously applies a pulse voltage, although the frequency of discharge occurrence increases compared with a capacitor circuit, the pulse needs to be generated a few times by the pulse generating circuit until the inter-electrode voltage rises to a voltage level at which a discharge reoccurs after a discharge has occurred and the inter-electrode voltage has decreased; therefore, it is difficult to generate discharges continuously and thus the effect of improving the treatment speed is limited. Moreover, most of the discharges to be generated have a high peak current value obtained by adding electric charge from the power source to the electric charge stored in the capacitor; therefore, the rate of occurrence of discharges having high discharge energy is high and thus it is difficult to obtain a discharge surface treated surface of a low surface roughness.

The present invention is achieved in view of the above and has an object to obtain a discharge surface treatment apparatus and a discharge surface treatment method capable of reducing a surface roughness and improving the treatment speed of the discharge surface treatment.

Solution to Problem

In order to solve the aforementioned problems, a discharge surface treatment apparatus that supplies an electrode material to a surface of a treatment target member by generating pulsating discharges across an inter-electrode gap, which is a clearance between a discharge surface treatment electrode and the treatment target member, and forms a coating of the electrode material according to one aspect of the present invention is configured in such a manner as to include: a switching element that turns application of a voltage from a power source to the inter-electrode gap on/off; a capacitance element that is connected to the switching element to be in parallel with the inter-electrode gap between the switching element and the inter-electrode gap; an inductance element that is connected in series between both of the switching element and the capacitance element and the inter-electrode gap; and a control unit that includes a function of periodically performing on/off so that an induced electromotive force generated in the inductance element due to a change in the current of discharge generated across the inter-electrode gap can be used as a voltage that induces the next discharge.

Advantageous Effects of Invention

According to the present invention, because the induced electromotive force generated in the inductance element due to the change in the current of the discharge generated in the inter-electrode gap can be used as a voltage that induces the next discharge, the discharge can be generated with high frequency. Moreover, because the discharge can be often caused to occur while the switching element is off, the rate of occurrence of discharges having low discharge energy can be improved. Therefore, the treatment speed of the discharge surface treatment can be improved and a discharge surface treated surface having a low surface roughness can be obtained.

BRIEF DESCRIPTION OF DRAWINGS

FIG. 3 is a diagram illustrating an operation (schematic diagram) of the discharge surface treatment apparatus according to the embodiment.

FIG. 4 is a diagram illustrating an evaluation condition according to the embodiment.

FIG. 9 is a diagram illustrating the machining time when the machining area is set to 500 mm$^2$ according to the embodiment.

FIG. 10 is a diagram illustrating a configuration of a discharge surface treatment apparatus.

FIG. 13 is a diagram illustrating an operation (when a discharge occurs) of the discharge surface treatment apparatus.

DESCRIPTION OF EMBODIMENTS

Figure 1:
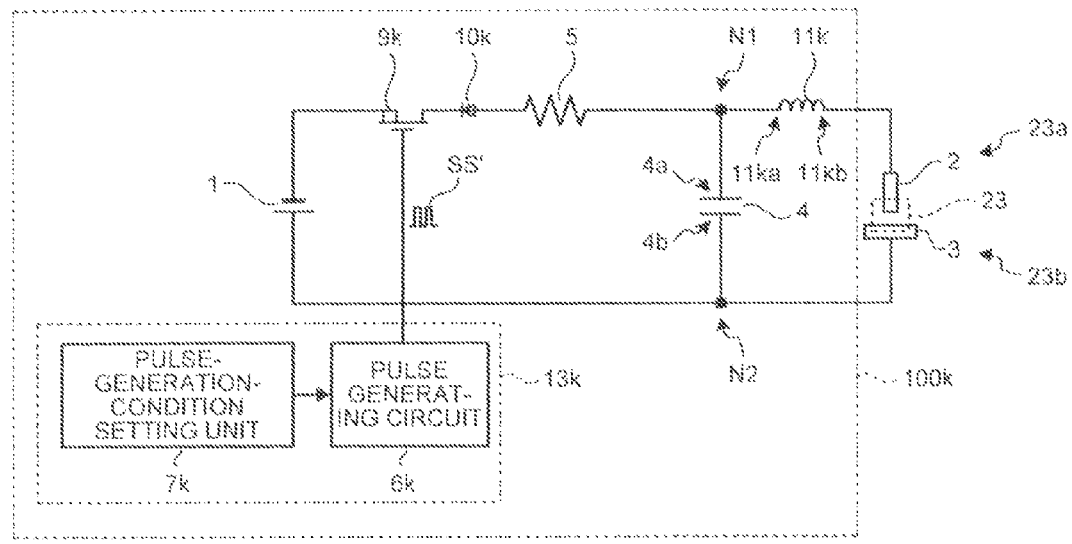
FIG. 1 is a diagram illustrating a configuration of a discharge surface treatment apparatus according to an embodiment.

An embodiment of a discharge surface treatment apparatus according to the present invention will be described below in detail with reference to the drawings. This invention is not limited to this embodiment.

Embodiment

Before explaining about a discharge surface treatment apparatus 100k according to the embodiment, a discharge surface treatment apparatus 100 will be explained with reference to FIG. 10. FIG. 10 is a diagram illustrating a configuration of the discharge surface treatment apparatus 100.

The discharge surface treatment apparatus 100 generates pulsating discharges across an inter-electrode gap 23, which is the clearance (for example, a minute clearance) between a discharge surface treatment electrode 2 and a treatment target member 3 in a machining fluid. The discharge surface treatment electrode 2 is made of a material suitable for the discharge surface treatment and is, for example, made of a material consisting mainly of Zn (Zn-based material). Consequently, the discharge surface treatment apparatus 100 performs the discharge surface treatment of forming a coating of an electrode material (for example, Zn-based material) on the surface of the treatment target member 3 by supplying the electrode material of the discharge surface treatment electrode 2 to the surface of the treatment target member 3. At this time, the discharge surface treatment apparatus 100 needs to generate low-energy discharges across the inter-electrode gap 23.

The discharge surface treatment apparatus 100 includes a circuit for generating low-energy discharges as illustrated in FIG. 10. Specifically, the discharge surface treatment apparatus 100 includes a DC power source 1, a current-limiting resistor 5, and a capacitance element 4.

The DC power source 1 configured such that its N-side (negative side) terminal 1a is connected to one end 23a (for example, the discharge surface treatment electrode 2) of the inter-electrode gap 23 via the current-limiting resistor 5 and a node N1, and its P-side (positive side) terminal 1b connected to the other end 23b (for example, the treatment target member 3) of the inter-electrode gap 23 via a node N2.

The current-limiting resistor 5 is provided in series on an N line NL that connects the N-side terminal 1a of the DC power source 1 and the one end 23a of the inter-electrode gap 23. For example, the current-limiting resistor 5 is connected at one end 5a to the N-side terminal 1a of the DC power source 1 and is connected at the other end 5b to the one end 23a of the inter-electrode gap 23 via the node N1.

The capacitance element 4 is connected to the current-limiting resistor 5 to be in parallel with the inter-electrode gap 23. For example, the capacitance element 4 configured such that its one end 4a is connected to the N line NL at the node N1 and the other end 4b of the capacitance element 4 is connected to a P line PL at the node N2. The P line PL is a line that connects the P-side terminal 1b of the DC power source 1 and the other end 23b of the inter-electrode gap 23.

In the discharge surface treatment apparatus 100, the DC power source 1 supplies machining electric power to the inter-electrode gap 23 and the capacitance element 4 is charged by the DC power source 1 via the current-limiting resistor 5. When the charging voltage of the capacitance element 4 is low, the discharge surface treatment electrode 2 and the treatment target member 3 in the inter-electrode gap 23 are insulated from each other; however, when the charging voltage of the capacitance element 4 becomes high, breakdown occurs between the discharge surface treatment electrode 2 and the treatment target member 3 and an electric discharge occurs in the inter-electrode gap 23; therefore, a discharge current flows from the capacitance element 4 to the inter-electrode gap 23 and the charging voltage of the capacitance element 4 decreases (electric charge is discharged from the capacitance element 4). The discharge surface treatment of the treatment target member 3 is performed by repeatedly charging and discharging the capacitance element 4.

In the discharge surface treatment apparatus 100, an electric discharge of low discharge energy, in which the peak current value is small and the pulse width is short, can be generated by adjusting the electrostatic capacitance of the capacitance element 4 and thus a treated surface having a low surface roughness can be obtained on the surface of the treatment target member 3.

However, in the discharge surface treatment apparatus 100, it takes a relatively long time to charge the capacitance element 4; therefore, a sufficient frequency of discharge occurrence cannot be obtained and thus a great deal of time is required for the treatment. At this time, in order to improve the treatment speed, it is considered sufficient to reduce the resistance value of the current-limiting resistor 5. However, if the resistance value of the current-limiting resistor 5 is reduced, a phenomenon in which the current flows incessantly occurs in some cases; therefore, a treated surface having a low surface roughness cannot be appropriately obtained. Thus, it is difficult to improve the treatment speed.

Figure 11:
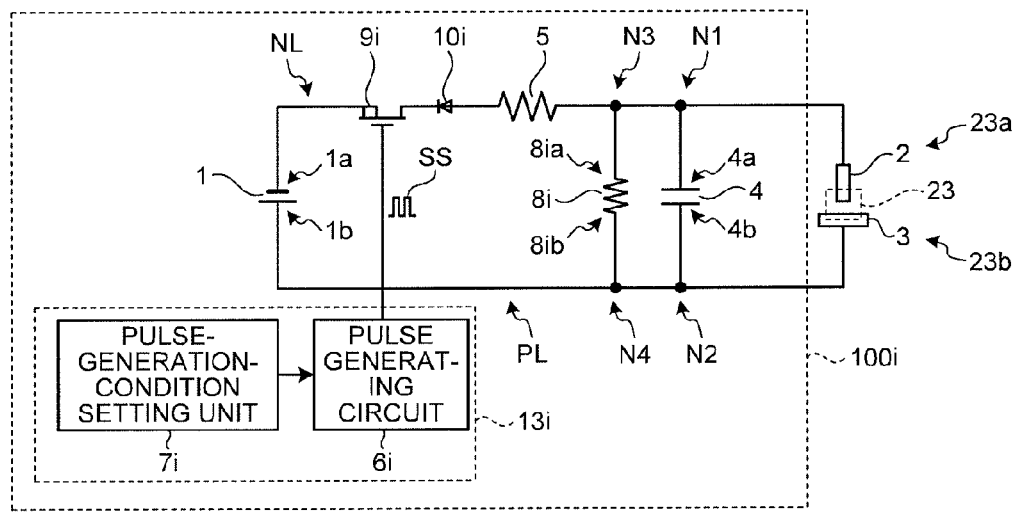
FIG. 11 is a diagram illustrating a configuration of a discharge surface treatment apparatus.

The inventors have also examined a discharge surface treatment apparatus 100i illustrated in FIG. 11, which is improved so that it applies pulse voltages more frequently than the discharge surface treatment apparatus 100 illustrated in FIG. 10. Specifically, the discharge surface treatment apparatus 100i further includes a switching element 9i, a diode 10i, an electric charge consuming resistor 8i, and a control unit 13i.

The switching element 9i is inserted in series on the N line NL. The switching element 9i turns on/off the application of the voltage from the DC power source 1 to the inter-electrode gap 23. The switching element 9i is, for example, a field-effect transistor (FET) or an insulated gate bipolar transistor (IGBT). For example, when a pulse signal (pulse train) SS in the active level is supplied to the control terminal (for example, gate or base) of the switching element 9i, the switching element 9i is turned on, thereby electrically connecting the N-side terminal 1a of the DC power source 1 and the one end 23a of the inter-electrode gap 23. Moreover, when the pulse signal (pulse train) SS at the non-active level is supplied to the control terminal of the switching element 9i, the switching element 9i is turned off, thereby interrupting the electrical connection between the N-side terminal 1a of the DC power source 1 and the one end 23a of the inter-electrode gap 23.

The capacitance element 4 is connected to the switching element 9i to be in parallel with the inter-electrode gap 23 between the switching element 9i and the inter-electrode gap 23. For example, the capacitance element 4 is configured such that its one end 4a is connected to the node N1 between the switching element 9i and the one end 23a of the inter-electrode gap 23 and the other end 4b is connected to the node N2 between the DC power source 1 and the other end 23b of the inter-electrode gap 23.

The diode 10i is inserted between the switching element 9i and the node N1 on the N line NL. For example, the diode 10i is electrically connected at its cathode to the switching element 9i and is electrically connected at its anode to the node N1.

The charge consuming resistor 8i is connected to the current-limiting resistor 5 to be in parallel with the inter-electrode gap 23 and the capacitance element 4. For example, the one end 8ia of the charge consuming resistor 8i is connected to the N line NL at a node N3 and the other end 8ib of the charge consuming resistor 8i is connected to the P line PL at a node N4.

The control unit 13i controls the on/off operation of the switching element 9i by supplying the pulse signal SS for driving the switching element to the control terminal of the switching element 9i. For example, the control unit 13i includes a pulse-generation-condition setting unit 7i and a pulse generating circuit 6i. The pulse-generation-condition setting unit 7i is, for example, composed of an NC device and sets the pulse generation conditions, such as the on/off time of each pulse, the number of pulses in a pulse train, and a quiescent time between a pulse train and another pulse train. The pulse generating circuit 6i obtains the pulse generation conditions from the pulse-generation-condition setting unit 7i, generates the pulse signal SS for driving the switching element in accordance with the pulse generation conditions, and supplies it to the control terminal of the switching element 9i.

In the discharge surface treatment apparatus 100i, the DC power source 1 supplies pulsating discharges to the inter-electrode gap 23. In accordance with the pulse signal SS for driving the switching element from the control unit 13i, when the pulse signal SS is in the active level (for example, H level), the switching element 9i is turned on and a voltage is applied across the discharge surface treatment electrode 2 and the treatment target member 3, and, when the pulse signal SS is in the non-active level (for example, L level), the switching element 9i is turned off and the voltage application between the discharge surface treatment electrode 2 and the treatment target member 3 is stopped.

Figure 12:
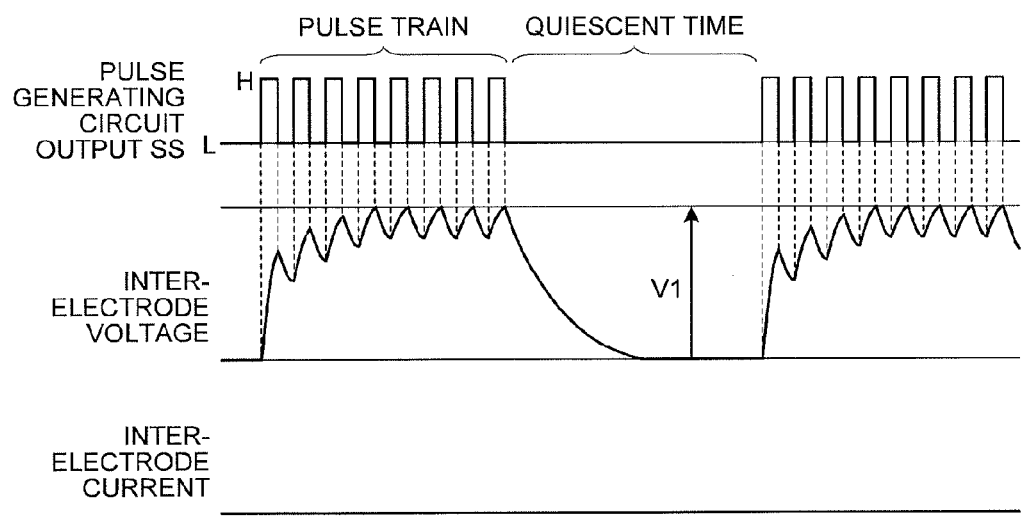
FIG. 12 is a diagram illustrating an operation (when the inter-electrode gap is open) of the discharge surface treatment apparatus.

FIG. 12 and FIG. 13 illustrate in a simplified manner the relationship among pulse trains from the pulse generating circuit 6i, the inter-electrode voltage applied across the inter-electrode gap 23 between the discharge surface treatment electrode 2 and the treatment target member 3, and the inter-electrode current flowing across the inter-electrode gap 23 in the discharge surface treatment apparatus 100i.

FIG. 12 illustrates a state (when the inter-electrode gap is open) in which the clearance (inter-electrode gap) between the discharge surface treatment electrode 2 and the treatment target member 3 is large and no electric discharge occurs. The capacitance element 4 is charged while the switching element 9i is on and the electric charge in the capacitance element 4 is discharged via the charge consuming resistor 8i while the switching element 9i is off. The charge consuming resistor 8i is provided mainly for consuming electric charge that is not consumed during the discharge and remains in the circuit; however, because the resistance value of the charge consuming resistor 8i is set sufficiently larger than the resistance value of the current-limiting resistor 5 provided for charging, even if the switching element 9i is turned off, the electric charge in the capacitance element 4 does not immediately disappear, and the inter-electrode voltage gradually increases in the ascending order of the first pulse, the second pulse, and so on in the pulse train and approaches a voltage V1 of the DC power source 1. In the quiescent time in which no pulse train is generated, the inter-electrode voltage decreases and finally reaches 0 V.

FIG. 13 illustrates a state where the discharge has occurred (at the time of discharge occurrence). The symbol A in FIG. 13 indicates a state where breakdown of the inter-electrode gap 23 has occurred while the voltage is rising in the third pulse of the pulse train and a discharge has occurred, and the inter-electrode current at this point is current obtained by adding the current flowing from the DC power source 1 via the switching element 9i and the diode 10i to the discharge current due to the electric charge stored in the capacitance element 4. The symbol B indicates a state where a discharge has occurred because the state where breakdown of the inter-electrode gap is likely to occur continued following the symbol A. The peak current value at this point is lower than the peak current value at the symbol A because the discharge has occurred in a state where the charging voltage of the capacitance element 4 is slightly low. The symbol C indicates a state where breakdown has occurred after the inter-electrode voltage gradually rises after the discharge at the symbol B and a discharge current flowed.

In this manner, when the discharge surface treatment is performed by using the discharge surface treatment apparatus 100i illustrated in FIG. 11, although the frequency of occurrence of discharges increases compared with the discharge surface treatment apparatus 100 illustrated in FIG. 10, as illustrated in FIG. 13, the pulse needs to be generated a few times by the pulse generating circuit until the inter-electrode voltage rises to the voltage level at which a discharge reoccurs after a discharge has occurred and the inter-electrode voltage has decreased; therefore, it is difficult to generate discharges continuously and thus the effect of improving the treatment speed is limited.

Furthermore, most of the discharges to be generated are a current having a high peak value, which is obtained by adding the current flowing from the DC power source 1 via the switching element 9i and the diode 10i to the electric charge stored in the capacitance element 4 as described above; therefore, the rate of occurrence of a discharge having high discharge energy is high and thus it is difficult to obtain a treated surface having a low surface roughness.

Considering all these facts above, in the present embodiment, an improvement illustrated in FIG. 1 is made to the discharge surface treatment apparatus 100i so that a discharge of low discharge energy is generated with high frequency. FIG. 1 is a diagram illustrating a configuration of the discharge surface treatment apparatus 100k according to the embodiment. In the following, the portions different from the discharge surface treatment apparatus 100i (see FIG. 11) will be mainly described.

The discharge surface treatment apparatus 100k includes a switching element 9k, a diode 10k, an inductance element 11k, and a control unit 13k. Although not shown in FIG. 1, an element having the same function as the charge consuming resistor 8i illustrated in FIG. 11 is also used in the present embodiment.

In a modification of the basic embodiment, as the switching element 9k, a switching element made of silicon (Si), such as an insulated gate bipolar transistor (IGBT) or a FET (MOSFET), in which a metal-oxide semiconductor is used, is considered to be used.

On the other hand, in the present embodiment, the switching element 9k is not limited to a switching element made of Si. It is of course possible to use a switching element made of silicon carbide (SiC) instead of Si as the switching element 9k.

Moreover, the diode 10k is not limited to a diode made of Si. It is of course possible to use a diode made of silicon carbide (SiC) instead of Si as the diode 10k.

Because a semiconductor element made of SiC has a feature that it can be used in the high-temperature range exceeding 200° C., if a switching element made of SiC is used as the switching element 9k included in the discharge machining and discharge surface treatment power supply apparatus, the allowable operating temperature of the switching element 9k can be increased. Thus, the problem with heat generation in the element can be alleviated. Consequently, the machining capability can be enhanced while avoiding or suppressing an increase in circuit size.

Moreover, because the switching element made of SiC has a high heat resistance, a heat radiator, such as a heatsink, added to the switching element 9k can be reduced in size; therefore, the apparatus can be further reduced in size.

Furthermore, because the power loss in the switching element made of SiC is low, the efficiency of the switching element 9k can be improved, which results in an improvement of the efficiency of the discharge surface treatment apparatus 100k.

SiC is one of the semiconductors referred to as a wide bandgap semiconductor due to the characteristics that SiC has a larger bandgap than Si. In addition to SiC, for example, a semiconductor formed by using a gallium nitride-based material or diamond is also a wide bandgap semiconductor and the characteristics thereof have a lot of similarities to those of SiC. Therefore, the configuration in which a wide bandgap semiconductor other than SiC is used is also within the scope of the present embodiment.

The inductance element 11k is connected in series between both of the switching element 9k and the capacitance element 4 and the inter-electrode gap 23. For example, one end 11ka of the inductance element 11k is electrically connected to the switching element 9k via the node N1 and is also electrically connected to the one end 4a of the capacitance element 4 via the node N1, while the other end 11kb of the inductance element 11k is electrically connected to the one end 23a of the inter-electrode gap 23.

The control unit 13k periodically turns the switching element 9k on/off so that the next discharge is induced by the induced electromotive force generated in the inductance element 11k due to the change in the current of the discharge generated across the inter-electrode gap 23. For example, in the on-period of the switching element 9k, the control unit 13k performs control to generate a discharge across the inter-electrode gap 23 due to the voltage applied across the inter-electrode gap 23 from the DC power source 1 via the switching element 9k. Moreover, in the off-period of the switching element 9k, the control unit 13k performs control to generate a discharge across the inter-electrode gap 23 by the induced electromotive force of the inductance element 11k in a state where the electrical connection between the DC power source 1 and the inter-electrode gap 23 is interrupted by the switching element 9k. A pulse-generation-condition setting unit 7k of the control unit 13k sets the pulse generation conditions including a pulse period suitable for inducing the next discharge by the induced electromotive force generated in the inductance element 11k due to the change in the current of the discharge generated across the inter-electrode gap 23 and a pulse generating circuit 6k of the control unit 13k generates a pulse signal SS' in accordance with such pulse generation conditions.

Figure 2:
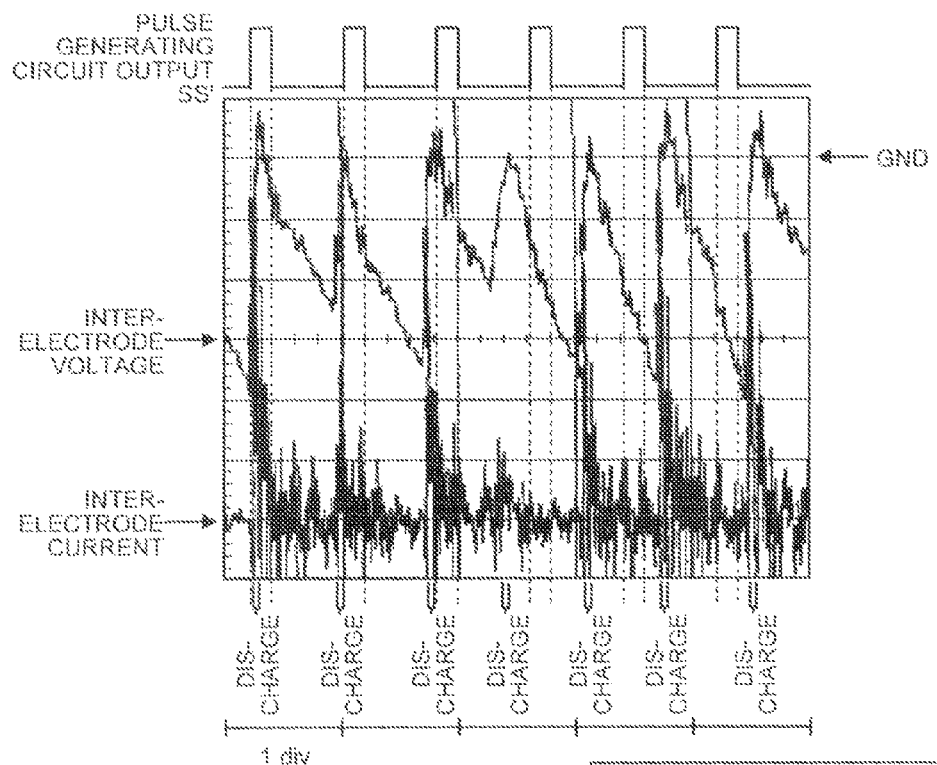
FIG. 2 is a diagram illustrating an operation (actual measured waveform) of the discharge surface treatment apparatus according to the embodiment.

Specifically, the control unit 13k performs control to cause the discharge surface treatment apparatus 100k to perform an operation as illustrated in FIG. 2 and FIG. 3.

The inventors of the present invention have produced the circuit illustrated in FIG. 1 on an experimental basis and have obtained on an oscilloscope the voltage waveform and current waveform of the inter-electrode gap 23 when the treatment is actually performed by using the circuit produced on an experimental basis. An example of the result is illustrated in FIG. 2. In FIG. 2, because the discharge-surface-treatment electrode side is set as a negative electrode, the obtained voltage waveform is inverted (voltage on the lower side of GND indicates high voltage). It is found from FIG. 2 that a discharge often occurs while the switching element 9k is off (during the off-time of a pulse) and the inter-electrode voltage rises while the switching element 9k is off (during the off-time of a pulse).

An explanation is given here as to why the state as illustrated in FIG. 2 is obtained with the configuration of FIG. 1.

FIG. 3 illustrates in a simplified manner the voltage and current waveforms of the inter-electrode gap 23 between the discharge surface treatment electrode 2 and the treatment target member 3 from the time at which the discharge starts to be generated in the configuration illustrated in FIG. 1 and the on/off state of each pulse. In FIG. 3, the positive side of the inter-electrode voltage is shown facing upward for ease of explanation.

The pulse generating circuit 6k generates the predetermined pulse signal (pulse train) SS' in accordance with an instruction, such as the on/off time of each pulse, from the pulse-generation-condition setting unit 7k in FIG. 1. When the switching element 9k is turned on, the DC power source 1 is connected to the inductance element 11k, and to the inter-electrode gap 23 between the discharge surface treatment electrode 2 and the treatment target member 3 and the like via the current-limiting resistor 5. Specifically, when the pulse generating circuit 6k generates a first pulse, the pulse generating circuit 6k turns on the switching element 9k only for the pulse on-time and applies a voltage for a predetermined time across the inter-electrode gap 23.

The symbol A' in FIG. 3 indicates a state where the voltage of the inter-electrode gap 23 rises and a discharge occurs at a certain timing during the pulse-on period. After a discharge as indicated by A' in FIG. 3 occurs, an induced electromotive force is generated in the inductance element 11k in accordance with the inductance value of the inductance element 11k and the amount of change in the current and the voltage across the inter-electrode gap 23 rises. Therefore, discharge of various patterns continuously occurs, such as a pattern in which a discharge occurs while the switching element 9k is off as indicated by the symbol B' in FIG. 3, a pattern in which the switching element 9k is turned on while the voltage across the inter-electrode gap 23 is rising by the induced electromotive force generated in the inductance element 11k and the voltage across the inter-electrode gap 23 rises further, and a discharge occurs after the switching element 9k is turned off as indicated by the symbol C' in FIG. 3, a pattern in which the voltage across the inter-electrode gap 23 rises by the induced electromotive force generated in the inductance element 11k and thereafter a discharge occurs while the switching element 9k is on as indicated by the symbol D' in FIG. 3, and a pattern in which the voltage across the inter-electrode gap 23 rises sharply while the switching element 9k is on and a discharge occurs while the switching element 9k is off as indicated by the symbol E' in FIG. 3.

The state of a discharge current in each pattern is as follows. At the timing of D' in FIG. 3, the switching element 9k is on; therefore, a current flows to the inter-electrode gap 23 from the DC power source 1 in addition to the electric charge in the capacitance element 4 and therefore a discharge having a high peak current value occurs. On the other hand, at the timings of B', C', and E' in FIG. 3, the switching element 9k is off; therefore, the current from the DC power source 1 does not flow and a discharge having a relatively low peak current value occurs. In E' in FIG. 3, because the state where breakdown is likely to occur continues, a discharge occurs in a state where the voltage is low. Thus, the peak current value is lower than those in B' and C' in FIG. 3.

As indicated by B', C', and E' in FIG. 3, the probability of occurrence of discharges while the switching element 9k is off and the slope of the voltage that rises while the switching element 9k is off change depending on the on/off time of each pulse and the magnitude of the inductance value of the inductance element 11k; however, the discharge in the patterns of B', C', and E' in FIG. 3, in which the peak current is relatively low, can be generated with high frequency by appropriately setting these values as described later. Thus, a treated surface having a low surface roughness can be formed on the surface of the treatment target member 3 at a high treatment speed. The induced electromotive force V generated in the inductance element 11k is, for example, represented by the following Expression 1.

$$V = L \cdot di/dt \quad \text{Expression 1}$$

As represented by Expression 1, an induced electromotive force is generated in the inductance element 11k when the current changes; however, in the circuit (see FIG. 1) in the present embodiment, the rise of voltage is recognized even after the current is interrupted. Although the reason is not exactly clear, it is speculated that the voltage rises due to the occurrence of the oscillation phenomenon in the circuit consisting of the inductance element 11k and the capacitance element 4 in addition to the induced electromotive force generated in the inductance element 11k due to the change in the current of a discharge pulse.

FIG. 2 and FIG. 3 and an example to be described later illustrate and describe a case where the on/off cycle of the switching element 9k is constant; however, the on/off cycle does not necessarily need to be constant and it should be obvious that the cycle may change on the basis of certain rules or randomly as long as it is periodic. It is important to periodically apply a voltage to form a pattern that increases the probability of discharge occurrence by the combination of the rise of voltage due to the change in the current of a discharge and the voltage application by turning on the switching element 9k.

Moreover, FIG. 3 illustrates that the periodic on/off of the switching element 9k is sequentially performed; however, in a similar manner to FIG. 12, a long quiescent time during which switching on/off is stopped may be provided at regular time intervals. For example, in the case where the treatment area is small, if the frequency of the occurrence of discharges is high, a large amount of electrode material remains in the inter-electrode gap 23, which may destabilize the discharge. In such a case, the discharge state can be stabilized by providing a quiescent time and reducing the frequency of discharges.

Next, the inventors have investigated the relationship between the probability of occurrence of a pattern in which a discharge occurs while the switching element 9k is off and the inductance value of the inductance element 11k. FIG. 4 illustrates the value of each main component of the power source and the like during the investigation of the relationship between the probability of occurrence of a pattern in which a discharge occurs while the switching element 9k is off and the inductance value of the inductance element 11k and during the evaluation and investigation to be described later. A Zn-based electrode is used for the discharge surface treatment electrode.

An electrode obtained by molding Zn-based power at a suitable pressing pressure is used as the Zn-based electrode in FIG. 4. Moreover, for the treatment target member 3, steel having a hardness of about 900 Hv is used. For the hardness measurement, a Vickers hardness tester HMV-2000 manufactured by Shimadzu Corporation is used, the load is set to 10 gf, and the holding time is set to 5 sec, and the average of the hardness measured at five points is determined as the hardness of a measured object. The discharge surface treatment is performed in synthetic discharge machining oil, in which paraffinic hydrocarbon is used as the base oil.

Next, an example of the formation of a Zn-based coating will be described. A Zn-based electrode is used to form the Zn-based coating. The treatment is performed by scanning the Zn-based electrode; however, because the Zn-based electrode is consumed as the discharge occurs, it is sent obliquely in response to the consumption. The feed rate in the consuming direction will be explained here. The feed rate in the consuming direction changes depending on, for example, the press-molding pressure or the like applied when the Zn-based electrode is manufactured; however, if the feed rate in the consuming direction is too small, discharge craters are not formed over the entire surface of the treatment target member, and, if the feed rate in the consuming direction is too large, the treatment time becomes long; therefore, the feed rate in the consuming direction is adjusted to the minimum amount with which discharge craters can cover the entire treated surface of the treatment target member.

In the Zn-based electrode used in the present embodiment, the peak current value during the treatment in the case where the inductance is provided is about 10 A on average and the pulse width (in the actual measurement by an oscilloscope, the current waveform is oscillated and therefore, the first width in this oscillating current waveform was set as the pulse width) is about $25 \times 10^{-9}$ sec. Moreover, the open voltage during the treatment is about 180 to 200 V.

In the present embodiment, the open voltage is the maximum voltage value in the range in which the voltage fluctuation is stabilized by turning the switching element $9k$ on/off in a state where the inter-electrode gap 23 is made sufficiently wide.

Figure 5:
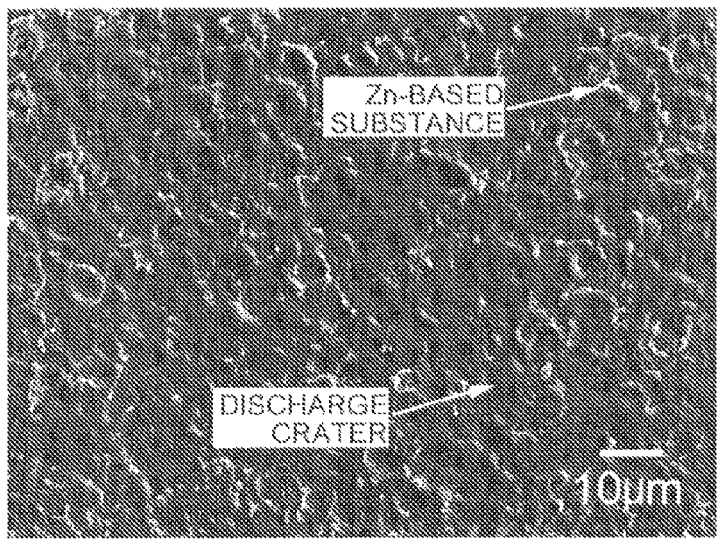
FIG. 5 is an electron micrograph of the surface of a treatment target member according to the embodiment.

FIG. 5 is a photograph when the surface of the Zn-based coating, which is formed by using the inductance element $11k$ of about 0.9 mH at 1 MHz, is observed under an electron microscope (SEM). As illustrated in FIG. 5, the Zn-based coating is formed such that Zn-based substances are welded around discharge craters formed by the discharge. The amount of Zn of the Zn-based coating changes depending on the press-molding pressure or the like applied to the Zn-based electrode. In the Zn-based electrode used in the present embodiment, the amount of Zn is about 8 wt % as a result of the investigation performed by using an electron probe microanalyzer (EPMA) of JXA-8530F manufactured by JEOL Ltd. The amount of Zn is analyzed by the Wavelength Dispersive X-Ray Spectroscopy (WDS). The amount of Zn is analyzed at three points under the conditions that the accelerating voltage is 15 kV, the irradiation current is 100 nA, the probe diameter is 300 μm, the dispersive crystal is LIFH, and the analysis time at the peak position and the background position at each analysis point is 10 sec and 5 sec, respectively, and the average Zn wt % of three points calculated on the basis of the peak intensity ratio with respect to the Zn standard sample is defined as the amount of Zn. It goes without saying that the wavelength region that does not overlap with the peak region of other detected elements is selected for the background.

Figure 6:
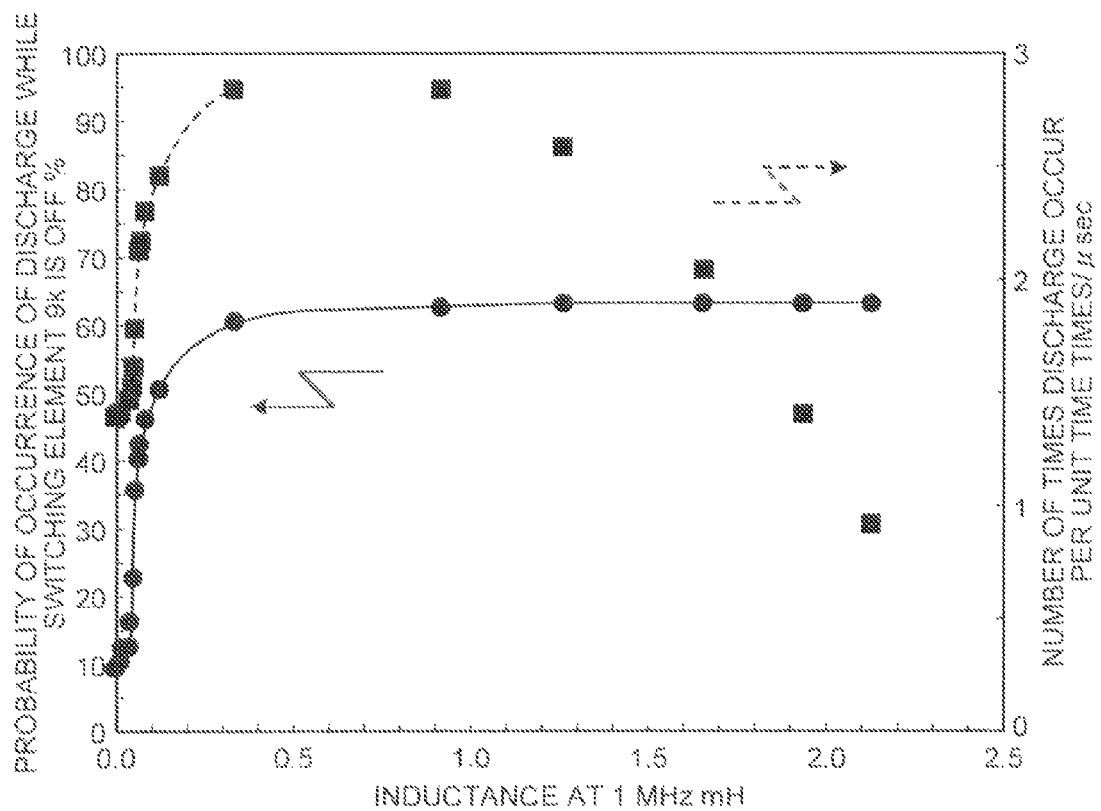
FIG. 6 is a diagram illustrating a relationship between the inductance, the probability of the occurrence of a discharge while a switching element is off, the number of discharges per unit time in a high inductance region, according to the embodiment.
Figure 7:
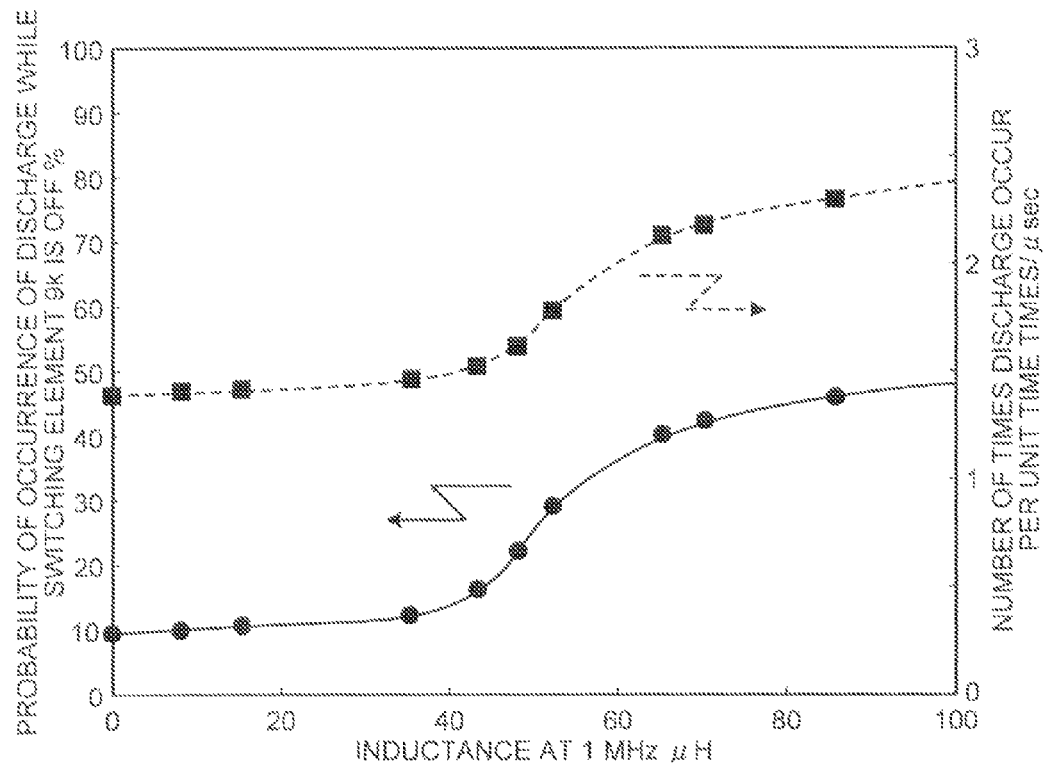
FIG. 7 is a diagram illustrating a relationship between the inductance, the probability of discharge occurrence while a switching element is off, the number of discharges per unit time in a low inductance region, according to the embodiment.

FIG. 6 and FIG. 7 illustrate the results obtained when performing an investigation of the probability of discharge occurrence and of the number of discharges per unit time while the switching element $9k$ is off in the case where the magnitude of the inductance value of the inductance element $11k$ in FIG. 1 is changed, in which each component of the power source is set to the value illustrated in FIG. 4. FIG. 7 illustrates the detail of the region in which the inductance value is small in FIG. 6. The inductance value 0 mH in FIG. 6 and the inductance value 0 μH in FIG. 7 mean that the inductance element $11k$ is not provided at the position illustrated in FIG. 1. Moreover, it is difficult to accurately recognize the effective frequency that acts on the inductance element $11k$ during the period in which the discharge occurs; therefore, in the present embodiment, the inductance value at 1 MHz (measured by a measuring instrument) is set as a parameter.

First, the probability of discharge occurrence while the switching element $9k$ is off will be described. It is found from FIG. 6 and FIG. 7 that the probability of discharge occurrence while the switching element $9k$ is off increases as the inductance value of the inductance element $11k$ increases, the probability of discharge occurrence while the switching element $9k$ is off starts increasing when the inductance value of the inductance element $11k$ at 1 MHz is about 50 μH or more, and the probability of discharge occurrence while the switching element $9k$ is off becomes approximately constant when the inductance value is about 0.3 mH or more. When the inductance value is 0 mH, the probability of the occurrence of a discharge while the switching element $9k$ is off does not become 0%. This is because breakdown occurs easily in the region in which the voltage applied across the inter-electrode gap 23 is high to some extent and thus the discharge occurs even without the switching element $9k$ necessarily being on.

The probability of occurrence of discharges while the switching element $9k$ is off has been investigated up to the inductance value of about 2.2 mH at 1 MHz. The probability of discharge occurrence while the switching element $9k$ is off increases as the inductance value of the inductance element $11k$ increases. This is considered to be because, as represented by the above Expression 1, if di/dt is the same, the induced electromotive force to be generated increases as L (the inductance value) increases and the voltage is likely to rise to the level at which the discharge occurs while the switching element $9k$ is off.

On the other hand, in terms of the number of discharges per unit time, the number of discharges per unit time increases as the inductance value increases, and the number of discharges per unit time improves compared with the case where the inductance element $11k$ is not provided at the position illustrated in FIG. 1 in the range where the inductance value at 1 MHz is 50 μH or more and 2 mH or less. In the above range, the most favorable range is 0.3 mH to 1.2 mH. If the inductance value exceeds 2 mH, the number of discharges per unit time tends to be lower than the case where the inductance element $11k$ is not provided at the position illustrated in FIG. 1.

This is considered to be because in the region with a relatively low inductance value, in which the number of discharges per unit time tends to increase, as described above, the induced electromotive force to be generated increases as the inductance value increases and the voltage rises easily to the level at which the discharge occurs while the switching element $9k$ is off. In the region with a relatively large inductance value (i.e., region in which the inductance value exceeds 2 mH), in which the number of discharges per unit time tends to decrease, the current may be difficult to flow due to an increase of the inductance value. Moreover, for example, because the length of the conductive wire of the coil used in the experiments increases, the electrical resistance actually increases and the flowability of current is affected; therefore, there may be factors other than the inductance value; however, this is not discussed in depth here.

As above, it is found that in the on/off cycle of the pulse in FIG. 4, the frequency of occurrence of discharges increases when the inductance at 1 MHz is in the range of 50 μH to 2 mH and the range of 0.3 mH to 1.2 mH is more favorable. In FIG. 6 and FIG. 7, the results in the case where the on/off cycle of the pulse is 0.1/0.3 μsec are illustrated; however, even when the on-time of a pulse is in the range of 0.05 μsec to 0.2 μsec and the off-time is in the range of 0.15 μsec to 0.6 μsec, results similar to FIG. 6 and FIG. 7 can be obtained. In this case, the range of the inductance value in which the effect can be obtained becomes about ±20%.

Next, the probability of occurrence of discharges while the switching element $9k$ is off and the discharge crater diameter of the Zn-based coating are investigated.

Figure 8:
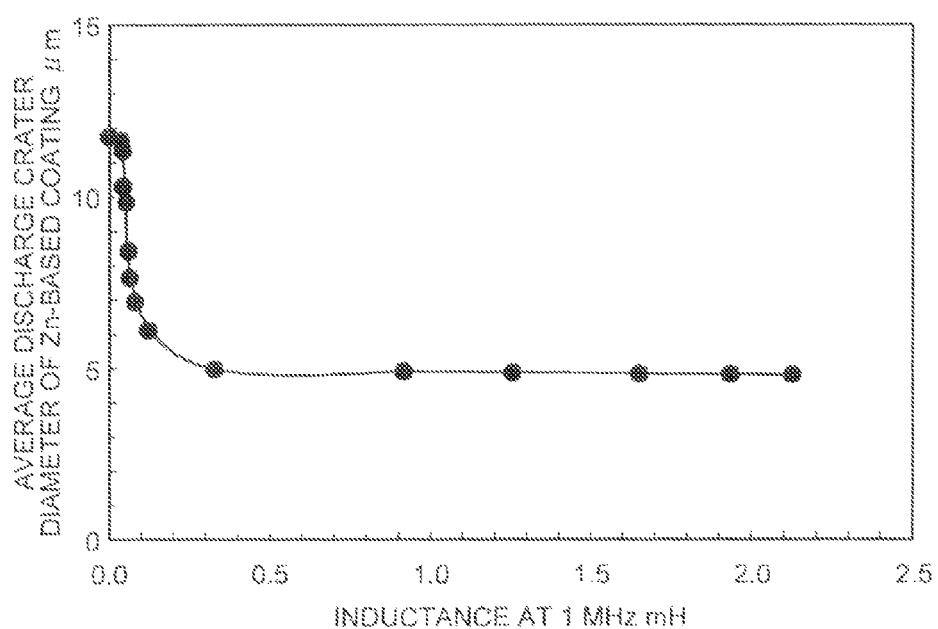
FIG. 8 is a diagram illustrating a relationship between the inductance and the discharge crater diameter of a Zn-based coating according to the embodiment.

FIG. 8 illustrates the relationship of the discharge crater diameter of the formed Zn-based coating when the magnitude of the inductance value of the inductance element $11k$ provided at the position illustrated in FIG. 1 is changed, in which each component of the power source is set to the value illustrated in FIG. 4. Although a surface roughness tester is typically used for evaluating surface roughness, as illustrated in FIG. 5, in the Zn-based coating, the discharge-surface-treatment electrode material is welded to the treated surface and the surface roughness changes depending on how the welded discharge-surface-treatment electrode material is formed. Thus, the discharge crater diameter is used as the evaluation index for the surface roughness. The discharge crater diameter of the Zn-based coating is measured by arbitrarily extracting five points that appear in a circular form on the basis of the observation photograph taken by the electron microscope and the scale, and the average thereof is set as the discharge crater diameter of the Zn-based coating. In FIG. 8, in a similar manner to the explanation in FIG. 6, the inductance 0 mH means that the inductance element 11$k$ is not provided at the position illustrated in FIG. 1.

In FIG. 8, the discharge crater diameter of the Zn-based coating decreases as the inductance value increases and the discharge crater diameter of the Zn-based coating becomes approximately constant when the inductance at 1 MHz is about 0.3 mH or more. The discharge crater diameter decreases as the inductance value increases. This is considered to be because, as illustrated in FIG. 6, the probability of discharge occurrence while the switching element 9$k$ is off increases and the rate of occurrence of discharges having a relatively low peak current value, in which electric charge does not flow from the DC power source 1 in FIG. 1, increases as described above. The region in which the inductance value is low is also investigated and it is found that the tendency for the discharge crater diameter to decrease starts becoming more pronounced when the inductance value is 50 μH or more. Accordingly, it is found that if the inductance at 1 MHz is 50 μH or more, a Zn-based coating having a small discharge crater diameter is obtained, i.e., a treated surface having a low surface roughness can be obtained, and an inductance in the range of 0.3 mH or more is more favorable.

Next, FIG. 9 illustrates the treatment time when the treatment area for the discharge surface treatment is set to 500 mm$^2$ by using the circuit having the configuration illustrated in FIG. 1 as an example. The treatment condition is set to the condition illustrated in FIG. 4, the inductance element 11$k$ whose inductance value at 1 MHz is about 0.9 mH is used at the position illustrated in FIG. 1, and the Zn-based coating is formed by scanning the Zn-based electrode as described above. The amount of Zn at that time is about 8 wt %. As a comparison example, the treatment time of the Zn-based coating is described, which is formed by a circuit having the configuration illustrated in FIG. 10 in which each element in the circuit is adjusted such that the amount of Zn and the discharge crater diameter are substantially equal to those in the example.

As illustrated in FIG. 9, for obtaining the Zn-based coating in which the amount of Zn, the discharge crater diameter, and the like are similar, in the example, the treatment time is significantly shortened compared with the comparison example. It can be said that this is because the frequency of occurrence of discharges is increased as described above by the discharge surface treatment apparatus according to the present embodiment.

As above, in the present embodiment, in the discharge surface treatment apparatus 100$k$ in which the inductance element 11$k$ is connected in series between both of the switching element 9$k$ and the capacitance element 4 and the inter-electrode gap 23, the control unit 13$k$ periodically turns the switching element 9$k$ on/off so that the next discharge is induced by the induced electromotive force generated in the inductance element 11$k$ due to the change in the current of the discharge generated in the inter-electrode gap 23. Consequently, the discharge can be generated with high frequency. Moreover, the discharge can be generated more often when the switching element is off; therefore, the rate of occurrence of discharges having low discharge energy can be improved. Thus, the treatment speed of the discharge surface treatment can be improved and a discharge surface treated surface having a low surface roughness can be obtained.

Moreover, in the present embodiment, in the off-period of the switching element 9$k$, the control unit 13$k$ controls to generate discharges by the induced electromotive force of the inductance element 11$k$. Consequently, a discharge of low discharge energy can be efficiently generated.

Moreover, in the present embodiment, the inductance value of the inductance element 11$k$ is, for example, 50 μH or more and 2 mH or less. Consequently, the frequency of discharge occurrence can be efficiently increased. For example, as illustrated in FIG. 6 and FIG. 7, if the inductance value of the inductance element 11$k$ is set to 50 μH or more and 2 mH or less, the frequency of occurrence of discharges can be increased compared with the case where the inductance element 11$k$ is not provided.

Moreover, in the present embodiment, the inductance value of the inductance element 11$k$ is, for example, 0.3 mH or more and 1.2 mH or less. Consequently, the frequency of occurrence of discharges can be increased more efficiently. For example, as illustrated in FIG. 6, if the inductance value of the inductance element 11$k$ is set to 0.3 mH or more and 2 mH or less, the probability of discharge occurrence while the switching element 9$k$ is off can be improved to about 60% or more; therefore, the number of discharges per 1 μsec can be improved to about 2.5 or more.

Moreover, in the present embodiment, the inductance value of the inductance element 11$k$ is, for example, 50 μH or more. Consequently, the discharge crater diameter of the coating on the surface of the treatment target member can be suppressed to be small. For example, as illustrated in FIG. 8, if the inductance value of the inductance element 11$k$ is set to 50 μH or more, the discharge crater diameter of the coating on the surface of the treatment target member can be suppressed to be small compared with the case where the inductance element 11$k$ is not provided.

Moreover, in the present embodiment, the inductance value of the inductance element 11$k$ is, for example, 0.3 mH or more. Consequently, the discharge crater diameter of the coating on the surface of the treatment target member can be suppressed smaller. For example, as illustrated in FIG. 8, if the inductance value of the inductance element 11$k$ is set to 0.3 mH or more, the discharge crater diameter of the coating on the surface of the treatment target member can be suppressed to about 5 μm or less.

Moreover, in the present embodiment, the switching element 9$k$ is made of a material consisting mainly of a wide bandgap semiconductor. For example, a wide bandgap semiconductor is a semiconductor in which silicon carbide, a gallium nitride-based material, or diamond is used. Consequently, the allowable operating temperature of the switching element 9$k$ can be increased; therefore, for example, the pulse frequency of pulse signals that drive the switching element 9$k$ can be improved, whereby the frequency of discharge occurrence can be improved from this viewpoint as well.

In the present embodiment, the explanation focuses on an example where the on-time is 0.1 μsec, the off-time is 0.3 μsec, and the inductance provided at the position indicated by 11 in FIG. 1 has an inductance value of about 0.9 mH at 1 MHz as the conditions of the pulse-generation-condition setting unit; however, the component provided at the position indicated by 11 in FIG. 1 may be a stray inductance other than the elements such as a coil, as long as the configuration is such that a pattern in which discharges are generated while the switching element is off is continuously generated.

Moreover, in the present embodiment, the case is exemplified where the Zn-based electrode is used for the discharge surface treatment electrode and steel is used for the treatment target member; however, the discharge surface treatment electrode is not limited to the Zn-based electrode and the treatment target member is not limited to steel. For the discharge surface treatment electrode, any material that is electrically conductive and is suitable for the discharge surface treatment, such as an Al-based, Mg-based, or Si-based material, can be used. For the treatment target member, in a similar manner, any material that is electrically conductive, such as a metal material, can be used. Furthermore, the present embodiment has been explained mainly as the discharge surface treatment power source; however, this can also be used as a discharge machining power source for small-hole electric-discharge machining, wire discharge machining, or the like, by adjusting the pulse generation conditions.

INDUSTRIAL APPLICABILITY

As above, the discharge surface treatment apparatus according to the present invention is suitable for the discharge surface treatment.

REFERENCE SIGNS LIST

1 DC power source
2 discharge surface treatment electrode
3 treatment target member
4 capacitance element
5 current-limiting resistor
6$i$, 6$k$ pulse generating circuit
7$i$, 7$k$ pulse-generation-condition setting unit
8$i$ charge consuming resistor
9$i$, 9$k$ switching element
10$i$, 10$k$ diode
11$k$ inductance element
13$i$, 13$k$ control unit
23 inter-electrode gap
100, 100$i$, 100$k$ discharge surface treatment apparatus

The invention claimed is:

1. A discharge surface treatment apparatus that supplies an electrode material to a surface of a treatment target member by generating pulsating discharges across an inter-electrode gap, which is a clearance between a discharge surface treatment electrode and the treatment target member, and forms a coating of the electrode material, comprising:
a switching element that turns application of a voltage from a power source to the inter-electrode gap on/off;
a capacitance element that is connected to the switching element to be in parallel with the inter-electrode gap between the switching element and the inter-electrode gap;
an inductance element that is connected in series between the switching element and the inter-electrode gap, and that is connected at one end to the capacitance element and at the other end to the inter-electrode gap; and
a control unit that includes a function of periodically performing on/off so that an induced electromotive force generated in the inductance element due to a change in the current of discharge generated across the inter-electrode gap can be used as a voltage that induces the next discharge.

2. The discharge surface treatment apparatus according to claim 1, wherein the control unit generates a discharge while the switching element is off by the induced electromotive force of the inductance element.

3. The discharge surface treatment apparatus according to claim 1, wherein an inductance value of the inductance element is 50 μH or more and 2 mH or less.

4. The discharge surface treatment apparatus according to claim 1, wherein the switching element is made of a material consisting mainly of a wide bandgap semiconductor.

5. The discharge surface treatment apparatus according to claim 4, wherein the wide bandgap semiconductor is a semiconductor in which a silicon carbide, a gallium nitride-based material, or a diamond is used.

6. A discharge surface treatment method of a discharge surface treatment apparatus that supplies an electrode material to the surface of a treatment target member by generating pulsating discharges across an inter-electrode gap, which is a clearance between a discharge surface treatment electrode and the treatment target member, and forms a coating of the electrode material, wherein
the discharge surface treatment apparatus includes
a switching element that turns application of a voltage from a power source to the inter-electrode gap on/off,
a capacitance element that is connected to the switching element to be in parallel with the inter-electrode gap between the switching element and the inter-electrode gap, and
an inductance element that is connected in series between the switching element and the inter-electrode gap, and that is connected at one end to the capacitance element and at the other end to the inter-electrode gap, and
the discharge surface treatment method includes periodically turning on/off the switching element so that a next discharge is induced by an induced electromotive force generated in the inductance element due to a change in the current of discharge generated across the inter-electrode gap.

7. The discharge surface treatment method according to claim 6, wherein the periodically turning on/off the switching element includes generating discharges while the switching element is off by an induced electromotive force of the inductance element.

8. The discharge surface treatment method according to claim 6, wherein an inductance value of the inductance element is 50 μH or more and 2 mH or less.

9. The discharge surface treatment method according to claim 6, wherein the switching element is made of a material consisting mainly of a wide bandgap semiconductor.

10. The discharge surface treatment method according to claim 9, wherein the wide bandgap semiconductor is a semiconductor in which a silicon carbide, a gallium nitride-based material, or a diamond is used.

* * * * *